United States Patent
Igarashi et al.

(10) Patent No.: US 8,803,304 B2
(45) Date of Patent: Aug. 12, 2014

(54) SEMICONDUCTOR PACKAGE AND MANUFACTURING METHOD THEREOF

(75) Inventors: Yohei Igarashi, Nagano (JP); Yasushi Araki, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 424 days.

(21) Appl. No.: 13/169,335

(22) Filed: Jun. 27, 2011

(65) Prior Publication Data
US 2011/0316172 A1  Dec. 29, 2011

(30) Foreign Application Priority Data
Jun. 29, 2010  (JP) .................. 2010-147196

(51) Int. Cl.
  *H01L 23/34*  (2006.01)
(52) U.S. Cl.
  USPC ............ 257/678; 257/730; 257/E33.058
(58) Field of Classification Search
  USPC ....................................... 257/686
  See application file for complete search history.

(56) References Cited

U.S. PATENT DOCUMENTS

2006/0267609 A1*  11/2006  Lee et al. ............. 324/754
2011/0193206 A1*  8/2011  Galera et al. ............. 257/676

FOREIGN PATENT DOCUMENTS

JP  2002-184936  6/2002

* cited by examiner

*Primary Examiner* — Julio J Maldonado
*Assistant Examiner* — Mohammad Choudhry
(74) *Attorney, Agent, or Firm* — Drinker Biddle & Reath LLP

(57) ABSTRACT

There is provided a semiconductor package that includes: a wiring board; a first semiconductor chip mounted on the wiring board; a second semiconductor chip mounted on the first semiconductor chip, wherein a size of second semiconductor chip is larger than that of the first semiconductor chip when viewed from a thickness direction of the semiconductor package; an insulating resin provided between the wiring board and the second semiconductor chip and between the wiring board and the first semiconductor chip so as to cover the first semiconductor chip; a base disposed on the wiring board to face a surface of the second semiconductor chip, wherein the insulating resin is provided between the base and the second semiconductor chip so as to cover the base.

4 Claims, 9 Drawing Sheets

REGION B

SEMICONDUCTOR PACKAGE AND MANUFACTURING METHOD THEREOF

This application claims priority from Japanese Patent Application No. 2010-147196, filed on Jun. 29, 2010, the entire contents of which are herein incorporated by reference.

BACKGROUND

1. Technical Field

Embodiments described herein relate to a semiconductor package and a method of manufacturing the semiconductor package.

2. Related Art

With the recent increase in the performance of electronic equipment using semiconductor devices such as semiconductor chips, it is now required to, for example, increase the density of semiconductor chips in mounting them on a wiring board and miniaturize semiconductor packages incorporating semiconductor chips (space saving).

To this end, various structures have been proposed for what is called the POP (package on package) semiconductor package in which plural semiconductor chips are stacked on a wiring board. Various techniques have also been proposed for the manufacturing method of the POP semiconductor package.

However, in the POP semiconductor package, the external size of the semiconductor chip needs to be decreased gradually as its stacking position goes higher. That is, there is a problem in that the external dimensions of semiconductor chips to be stacked are restricted.

A semiconductor package 100 shown in FIG. 6 and its manufacturing method have been proposed for solving the above problem (see e.g., JP-A-2002-184936). More specifically, the semiconductor package 100 is a semiconductor device in which a first LSI chip 104 is mounted on a circuit board 103 and a larger, second LSI chip 106 is mounted on the first LSI chip 104. Underfill 110 that fills the space between the first LSI chip 104 and the circuit board 103 projects from the outer periphery and the top surface of the projected portion of the underfill is flush with that of the first LSI chip 104. In this manner, a base for receiving the bottom surface of the larger, second LSI chip 106 is formed to enable stable mounting of the second LSI chip 106. The restrictions relating to the chip external dimensions can be relaxed, and the semiconductor package 100 can be produced stably and is given high reliability.

The present applicant produced, on a trial basis, a semiconductor package 200 shown in FIG. 9 which has the same POP structure as the semiconductor package 100 and studied it to find the following problems.

First, a manufacturing method of the semiconductor package 200 will be outlined. Gold bumps 211 are formed on electrodes of a first semiconductor chip 210 and solder coats 237 are formed on electrodes 232 of a wiring board 230 to which the first semiconductor chip 210 is to be connected. Then, a thermosetting resin film 203 (insulating resin) as typified by NCF (non-conductive film) 203 is bonded to the wiring board 230. Also, an element 203 is not limited to a thermosetting resin film. For example, the element 203 may be an insulating film. Then, the gold bumps 211 of the first semiconductor chip 210 are connected, by thermo-compression bonding, to the solder coats 237 of the wiring board 230 to which the thermosetting resin film 203 is bonded. At this time, the thermosetting resin film 203 is set to a certain extent. Then, the thermosetting resin film 203 is set completely by keeping it at a prescribed temperature for a prescribed time. Finally, a second semiconductor chip 220 is die-bonded to the first semiconductor chip 210.

In the manufacturing method having the above steps of the semiconductor package 200, when the first semiconductor chip 210 is connected to the wiring board 230 by thermo-compression bonding, the thermosetting resin film 203 flows out from the outer periphery of the space between the first semiconductor chip 210 and the wiring board 230 as seen from the photograph of FIG. 7 (taken with the second semiconductor chip 220 removed). The thermosetting resin film 203 has a property that at this time it expands in a concentric manner (circularly) about the center of the film 203 (see FIG. 7).

The following problem was found in this manufacturing step. In a design that the second semiconductor chip 220 overhangs the first semiconductor chip 210 (L: overhang length), that is, in a case that the external size of the second semiconductor chip 220 is larger than that of the first semiconductor chip 210, cavities C tend to be formed under peripheral portions 220a (in particular, corner portions) of the second semiconductor chip 220 during the manufacturing step concerned as shown in the photograph of FIG. 8 (an enlarged version of a corner portion B in FIG. 7) and the schematic sectional view of FIG. 9 (taken perpendicularly to the paper surface of FIG. 7). If such cavities C are formed, the second semiconductor chip 220 may be warped in a step of connecting electrodes (not shown) formed on the top surfaces of the peripheral portions 220a of the second semiconductor chip 220 to electrodes 233 formed on the wiring board 230 by wire bonding, as a result of which their connections may be rendered unstable. Furthermore, in a step of molding the entire structure, a gap may be formed in the interface between the first semiconductor chip 210 and the second semiconductor chip 220 to increase the probability of occurrence of a mold void. These problems are more serious when the overhang length L of the second semiconductor chip 220 is greater.

In view of the above problems, in the conventional technique, it is intended to prevent formation of cavities by reducing the overhang length by using, as part of a base, that portion of the thermosetting resin film which flows out from the space between the first semiconductor chip and the wiring board. However, it is very difficult to stably form a base having a prescribed shape (the shape depends on the amount of resin that flows out) because of variations in process conditions and the dimensions of the members involved. On the other hand, if it is attempted to secure a sufficiently wide base by using a large thermosetting resin film, because of the above-mentioned property that the thermosetting resin film tends to expand in a concentric manner (circularly), an excessive amount of resin flows out from the sidelines, resulting in a problem that wire-bonding electrodes of the wiring board are covered with the expanded portions of the thermosetting resin film.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a semiconductor package. The semiconductor package includes: a wiring board; a first semiconductor chip mounted on the wiring board; a second semiconductor chip mounted on the first semiconductor chip, wherein a size of second semiconductor chip is larger than that of the first semiconductor chip when viewed from a thickness direction of the semiconductor package; an insulating resin provided between the wiring board and the second semiconductor chip and between the wiring board and the first semiconductor chip so as to cover the first semiconductor chip; a base disposed on the wiring board to face a surface of the second semiconductor chip, wherein the insulating resin is provided between the base and the second semiconductor chip so as to cover the base.

According to one or more illustrative aspects of the present invention, there is provided a method of manufacturing a semiconductor package. The method includes: (a) providing a wiring board; (b) forming a base on the wiring board; (c) laminating a thermosetting resin film on the wring board to cover the base; (d) flip-chip bonding a first semiconductor chip to the wiring board via the thermosetting resin film by pressing the first semiconductor chip against the wiring board via the thermosetting resin film while heating the first semiconductor chip.

Other aspects and advantages of the present invention will be apparent from the following description, the drawings and the claims.

DETAILED DESCRIPTION OF EXEMPLARY EMBODIMENTS

Figure 1:
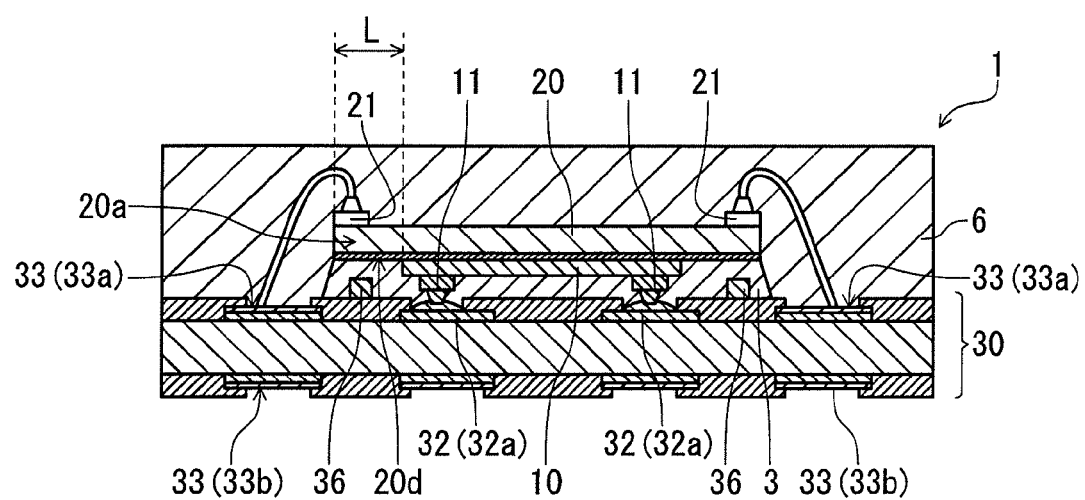
FIG. 1 is a schematic sectional view of a semiconductor device according to an embodiment of the present invention.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

A semiconductor package 1 according to an embodiment of the present invention will be hereinafter described.

FIG. 1 is a schematic sectional view of the semiconductor package 1. It should be noted that for convenience of description members shown in each drawing need not always be drawn according to their actual dimensions or a scale.

The semiconductor package 1 is a POP semiconductor package in which a first semiconductor chip 10 is mounted on a wiring board 30 and a second semiconductor chip 20 is mounted on the first semiconductor chip 10. More specifically, the first semiconductor chip 10 is flip-chip-connected to the wiring board 30 via a thermosetting resin film 3 by thermo-compression bonding and the second semiconductor chip 20 is bonded to the first semiconductor chip 10 by die bonding.

Figure 3A:
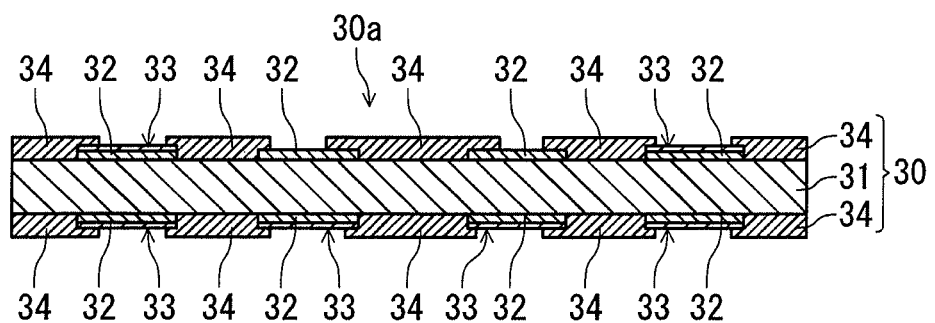
FIGS. 3A-3C are schematic sectional views to explain a manufacturing method of the semiconductor package according to the embodiment.

As shown in FIG. 3A, the top surface and the bottom surface of the wiring board 30 are formed with electrodes 32 and 33 for connection to the first semiconductor chip 10 or external connection.

In the first semiconductor chip 10, a surface 10a which is opposed to the wiring board 30 is provided with connection bumps 11 which are connected to the electrodes 32. For example, the connection bumps 11 may be made of gold.

On the other hand, the top surface 20e of the second semiconductor chip 20 is provided with electrodes (not shown) in a region corresponding to a peripheral portion 20a. The electrodes are wire-bonded to the electrodes 33 which are provided on the wiring board 30 outside the mounting area of the first semiconductor chip 10.

Typically, the semiconductor package 1 is molded with a mold resin 6. However, the semiconductor package 1 may be distributed in a non-molded form.

The first semiconductor chip 10 is bonded to the wiring board 30 via the thermosetting resin film 3 by thermo-compression bonding. The external size of the second semiconductor chip 20 which is mounted on the first semiconductor chip 10 is larger than that of the first semiconductor chip 10, that is, the second semiconductor chip 20 has a long overhang (L: overhang length). For example, the first semiconductor chip 10 is shaped like a square whose sidelines are about 4 mm long, and the second semiconductor chip 20 is shaped like a square whose sidelines are about 8 mm long. The overhang length is about 2 mm.

Figure 2A:
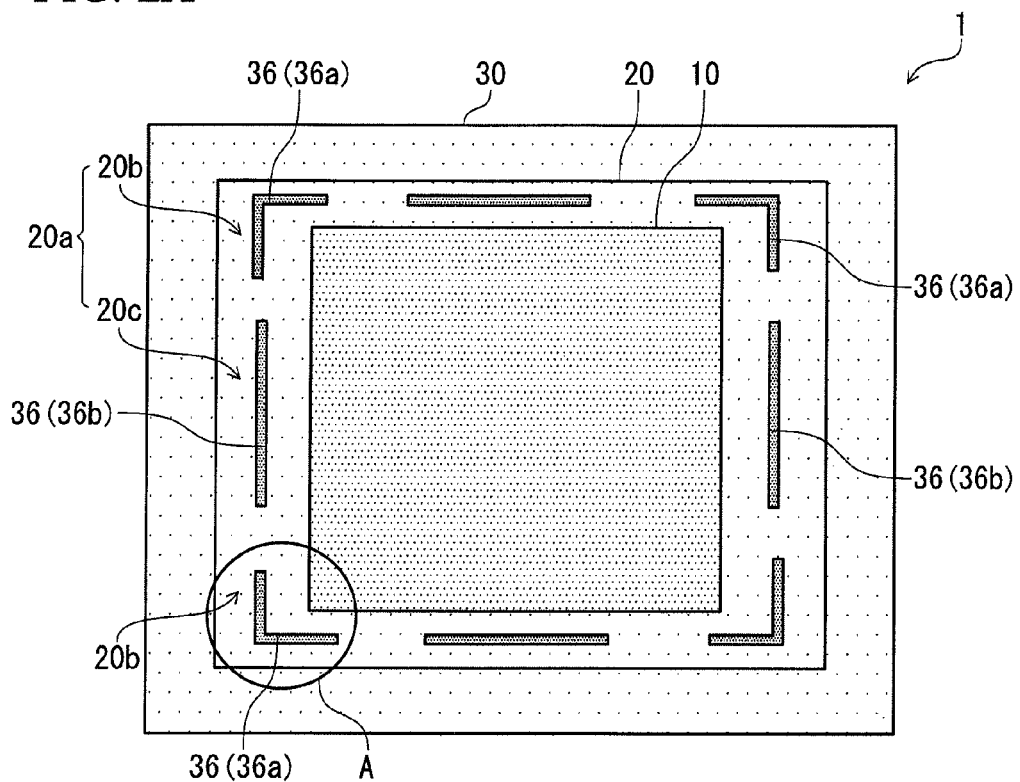
FIGS. 2A-2C show how bases of the semiconductor device are formed.

Projection-like bases 36 whose tops do not in contact with the bottom surface 20d of the second semiconductor chip 20 are provided right under the peripheral portion 20a of the second semiconductor chip 20. Example positions and shapes of the bases 36 will be described with reference to FIGS. 2A-2C. FIG. 2A is a schematic plan view of the semiconductor package 1 in which the second semiconductor chip 20 is indicated by only an outer circumferential line. Working effects of the bases 36 will be explained later in a description of a manufacturing method.

For example, corner bases 36a are formed on the wiring board 30 at positions corresponding to corner portions 20b of the second semiconductor chip 20. If necessary, side bases 36b are provided at positions corresponding to side portions 20c, each located between adjoining corner portions 20b, of the second semiconductor chip 20 so as not to be continuous with the corner bases 36a. Alternatively, the side bases 36b may be continuous with the corner bases 36a.

Figure 2B:
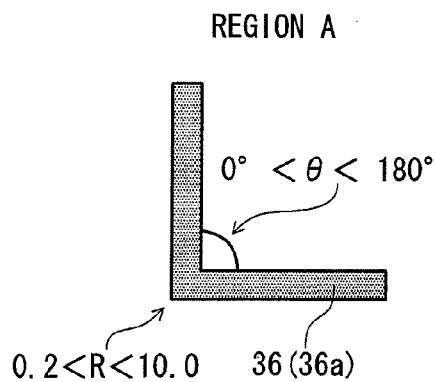
Figure 2C:
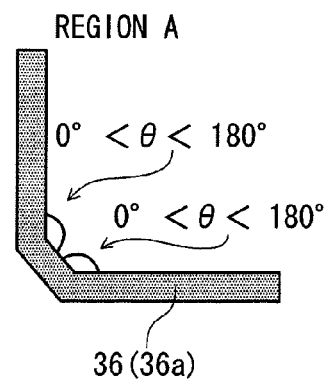

For example, as shown in FIG. 2B, each corner base 36a is formed so as to be approximately L-shaped. The angle θ formed by the two legs is larger than 0° and smaller than 180°. Each corner base 36a is more like a straight line than an L shape when the angle θ is large. The corner radius R of each corner base 36a is larger than about 0.2 μm and smaller than about 10 μm. As shown in FIG. 2C, each corner base 36a may have a large chamfer. As a further alternative, each corner base 36a may be shaped like a round shape (not shown).

On the other hand, as show in FIG. 2A, each side base 36b is formed straightly along the associated side portion 20c.

For example, the corner bases 36a and the side bases 36b are both as wide as about 0.3 to 0.8 mm and the upper limit of their width is equal to the distance between the outer periphery of the first semiconductor chip 10 and the inner peripheries of the electrodes 33 (for wire bonding to electrodes of the second semiconductor chip 20) of the wiring board 30. The corner bases 36a and the side bases 36b both have an approximate height of 10 μm to several tens of micrometers.

In the semiconductor package 1 according to the embodiment, the bases 36 are covered with the thermosetting resin film 3, that the top surface of that portion of the thermosetting resin film 3 which is outside the outer periphery of the first semiconductor chip 10 is flat and flush with that of the first semiconductor chip 10, and a peripheral portion of the thermosetting resin film 3 which is outside the outer periphery of the second semiconductor chip 20 has a fillet shape.

Next, a method of manufacturing the semiconductor package 1 will be now described. FIGS. 3A-3C to FIGS. 5A-5C are schematic sectional views to explain the manufacturing method of the semiconductor package 1.

First, a wiring board 30 is prepared as shown in FIG. 3A. The wiring board 30 is a printed wiring board manufactured by a known method using a resin board 31, and a description of its manufacturing process is omitted herein. For example, the wiring board 30 includes electrodes 32 made of copper, electrodes 33 in each of which a gold plating layer is formed on a copper electrode 32, and insulating layers 34 which are solder resists.

Figure 3B:
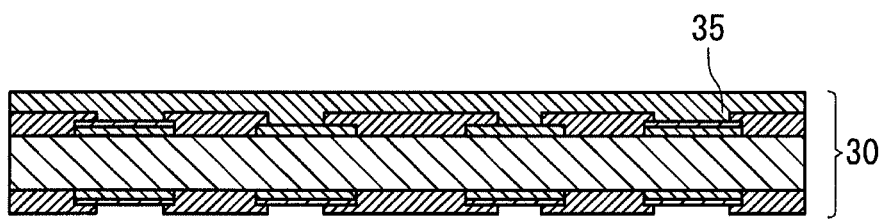
Figure 3C:
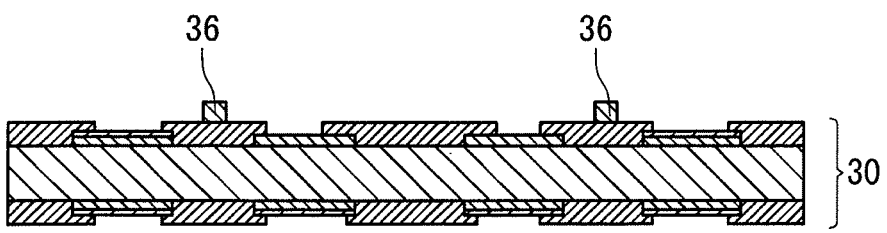

As shown in FIG. 3B, a photosensitive resist 35 is applied to the top surface 30a of the wiring board 30. After the photosensitive resist 35 is illuminated with light via a mask pattern (not shown), development and peeling are performed. As a result, as shown in FIG. 3C, bases 36 having prescribed shapes are formed right under an area to be occupied by a peripheral portion 20a of a second semiconductor chip 20 in a later step.

The bases 36 are formed as described above with reference to FIGS. 2A and 2B. In the embodiment, corner bases 36a are formed on the top surface 30a of the wiring board 30 at positions corresponding to positions where corner portions 20b of the second semiconductor chip 20 are to be placed in the later step. And side bases 36b are formed on the top surface 30a of the wiring board 30 at positions corresponding to positions where side portions 20c, each located between adjoining corner portions 20b, of the second semiconductor chip 20 are to be placed in the later step, so as not to be continuous with the corner bases 36a. Alternatively, the side bases 36b may be formed so as to be continuous with the corner bases 36a. Only the corner bases 36a may be formed depending on the arrangement of the electrodes 33 (33a) in the top surface 30a of the wiring board 30, the shape of a first semiconductor chip 10, and other factors.

Other example processes for forming the bases 36 are a laminating method (a resist is laminated with an area other than base regions masked), a flat plate punching method (a major portion other than base portions are punched away using a metal die), and a blast method (a major portion other than base portions is blasted off).

Figure 4A:
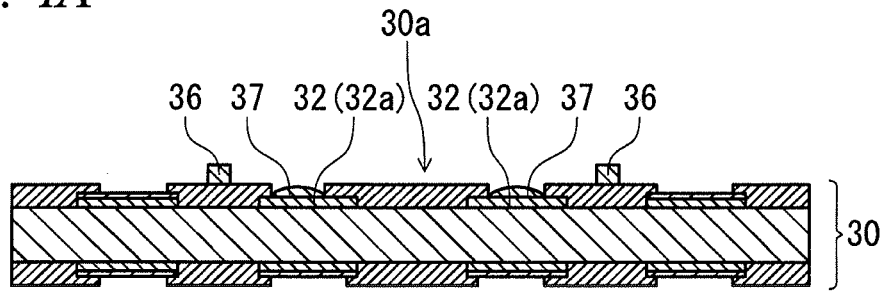
FIGS. 4A-4C are schematic sectional views to explain the manufacturing method of the semiconductor package according to the embodiment.

Then, as shown in FIG. 4A, solder coats 37 are formed on electrodes 32a to which connection bumps 11 of the first semiconductor chip 10 are to be connected among the electrodes 32 of the wiring board 30.

Figure 4B:
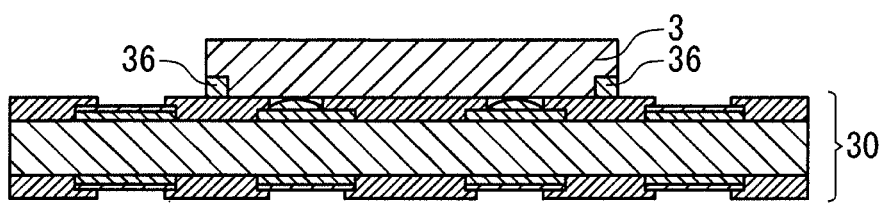

Then, as shown in FIG. 4B, a thermosetting resin film 3 is laminated on the top surface 30a of the wiring board 30 at the center in the subject area. More specifically, the thermosetting resin film 3 is laminated in the rectangular area defined by the bases 36 (36a and 36b) (see FIG. 2A). The thermosetting resin film 3 is also laminated on the top surfaces of the bases 36. Therefore, in the embodiment, the thermosetting resin film 3 has a rectangular shape. Also, the thermosetting resin film 3 may be laminated on the wiring board 30 such that sides of the thermosetting resin film 3 are aligned with outer sides of the bases 36. However, the shape of the thermosetting resin film 3 may be changed as appropriate according to the arrangement of the bases 36.

The thermosetting resin film 3 is made of an epoxy thermosetting resin, for example. And an example method for laminating the thermosetting resin film 3 on the wiring board 30 is a vacuum lamination method.

Figure 4C:
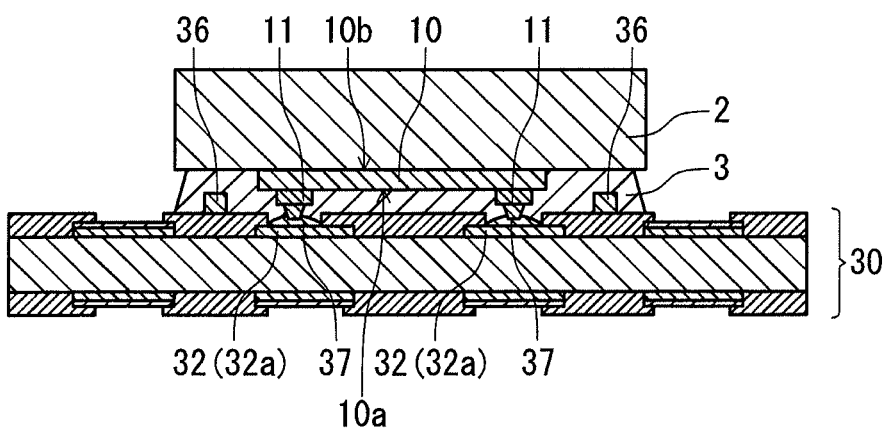

Then, as shown in FIG. 4C, the first semiconductor chip 10 is placed on the top surface 30a of the wiring board 30 via the thermosetting resin film 3 at the prescribed mounting position with its wiring surface 10a opposed to the top surface 30a of the wiring board 30. Then, a bonding tool (heating head) 2 is pressed against the surface 10b, opposite to the wiring surface 10a, of the first semiconductor chip 10 and heating is performed while the first semiconductor chip 10 is pushed by the bonding tool 2.

As a result, the thermosetting resin film 3 which is sandwiched between the first semiconductor chip 10 and the wiring board 30 is pressed and expanded and thereby not only fills the space between the first semiconductor chip 10 and the wiring board 30 but also goes over the top surfaces of the bases 36 and flows away from the outer periphery of the first semiconductor chip 10. The connection bumps 11 of the first semiconductor chip 10 are brought into contact with the solder coats 37 on the electrodes 32a of the wiring board 30, respectively. Furthermore, the solder coats 37 on the electrodes 32a of the wiring board 30 are heated via the first semiconductor chip 10 and thereby melted. The connection bumps 11 and the solder coats 37 which have been in contact with each other are joined to each other. At the same time, the thermosetting resin film 3 which fills the space between the first semiconductor chip 10 and the wiring board 30 is heated and set.

At this time, the thermosetting resin film 3 is shaped so as to cover the bases 36. The top surface of that portion of the thermosetting resin film 3 which has flown out from the outer periphery of the first semiconductor chip 10 is made a flat surface that is flush with the top surface (opposite to the wiring surface 10a) of the first semiconductor chip 10 without forming any step or gap. Furthermore, a peripheral portion of the thermosetting resin film 3 which is to be located outside the outer periphery of the second semiconductor chip 20 is given a fillet shape.

The bases 36 provide the following advantages. Since the distance between the top surfaces of the bases 36 and the pressing surface of the bonding tool 2 is shorter than that between the top surface 30a of the wiring board 30, an increased amount of thermosetting resin film 3 flows out from the outer periphery of the first semiconductor chip 10 beyond the bases 36.

Figure 9:
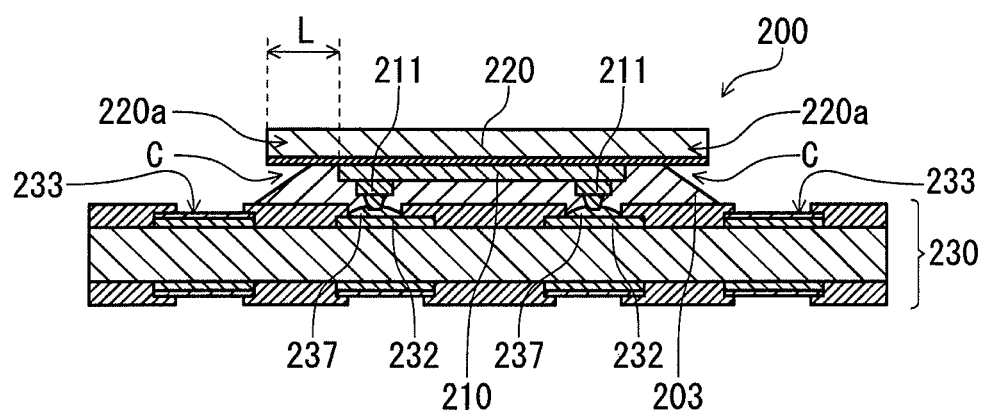
FIG. 9 is a schematic sectional view to explain the configuration and the problems of the semiconductor package which the present applicant produced on a trial basis and studied.

In particular, since an increased amount of thermosetting resin film 3 flows out from the outer periphery of the first semiconductor chip 10 beyond the corner bases 36a, the thermosetting resin film 3, which tends to expand in a concentric manner (circularly) in itself, can be expanded in an approximately rectangular form. As a result, where the external size of the second semiconductor chip 20 is larger than that of the first semiconductor chip 10, the thermosetting resin film 3 can reach the spaces right under the outermost portions of the outer peripheral portion 20a (in particular, corner portions 20b) of the second semiconductor chip 20, whereby formation of cavities as described above with reference to FIG. 9 can be prevented.

Figure 5A:
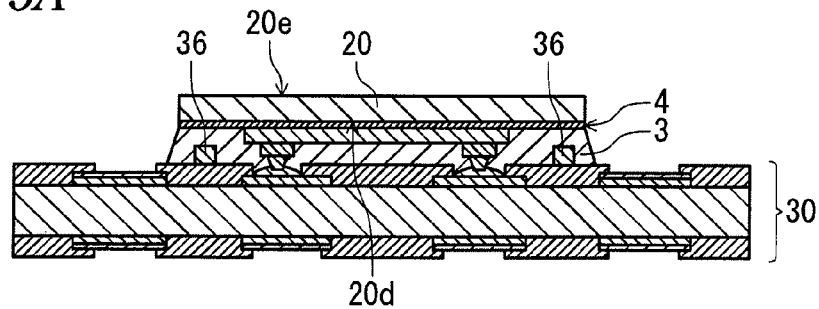
FIGS. 5A-5C are schematic sectional views to explain the manufacturing method of the semiconductor package according to the embodiment.

Subsequently, as shown in FIG. 5A, the second semiconductor chip 20 is mounted on the thus-formed flat surface via a fixing member 4 with a wiring surface 20e up. For example, curing is performed after mounting of the second semiconductor chip 20, whereby the fixing member 4 is set and the second semiconductor chip 20 is fixed to the flat surface which consists of the top surface (opposite to the wiring surface 10a) 10b of the first semiconductor chip 10 and the top surface of that portion of the thermosetting resin film 3 which has flown out from the outer periphery of the first semiconductor chip 10.

The fixing member 4, which is a bonding sheet made of a resin material (e.g., epoxy resin), is laminated on the flat surface which consists of the top surface (opposite to the wiring surface 10a) 10b of the first semiconductor chip 10 and the top surface of that portion of the thermosetting resin film 3 which has flown out from the outer periphery of the first semiconductor chip 10, by a lamination method such as a roll lamination method or a vacuum lamination method. Alternatively, the fixing member 4 may be an epoxy, polyimide, or like adhesive.

Figure 5B:
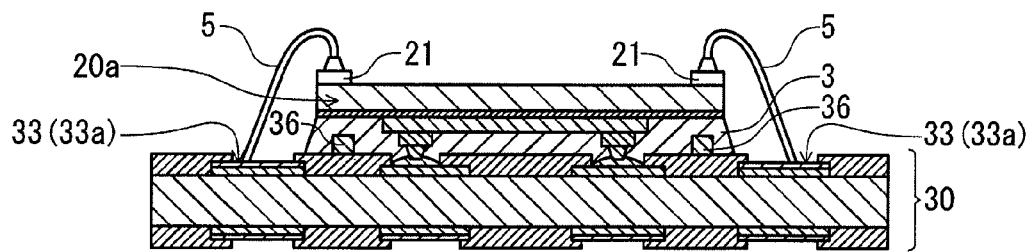

Then, as shown in FIG. 5B, electrodes (not shown) provided on the wiring surface 20e of the second semiconductor chip 20 are connected to the electrodes 33 (33a) of the wiring board 30 by gold wires 5 by a known wire bonding method. Reference numeral 21 denotes deformed versions of compression bonding balls provided at the tips of the wires 5 when the compression bonding balls are pressed against the electrodes provided on the wiring surface 20a of the second semiconductor chip 20 in a fast bonding step.

Figure 5C:
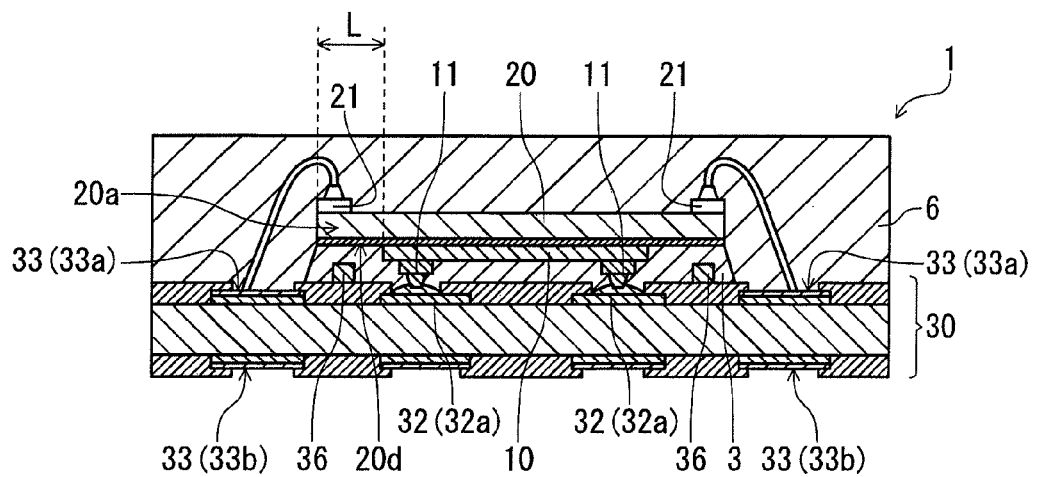
Figure 6:
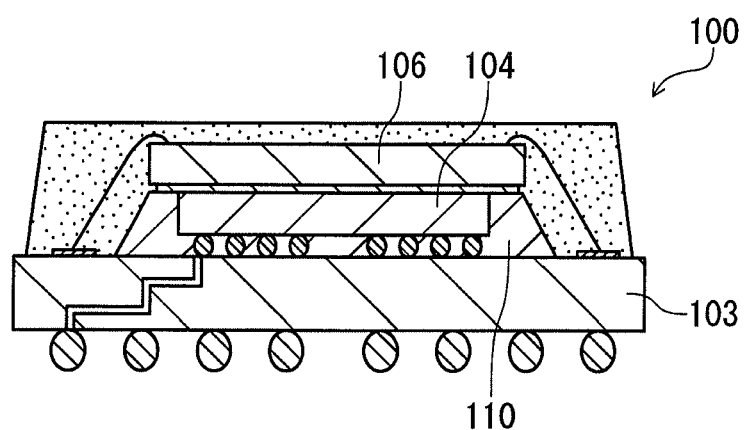
FIG. 6 is a schematic sectional view of a related-art semiconductor package.
Figure 7:
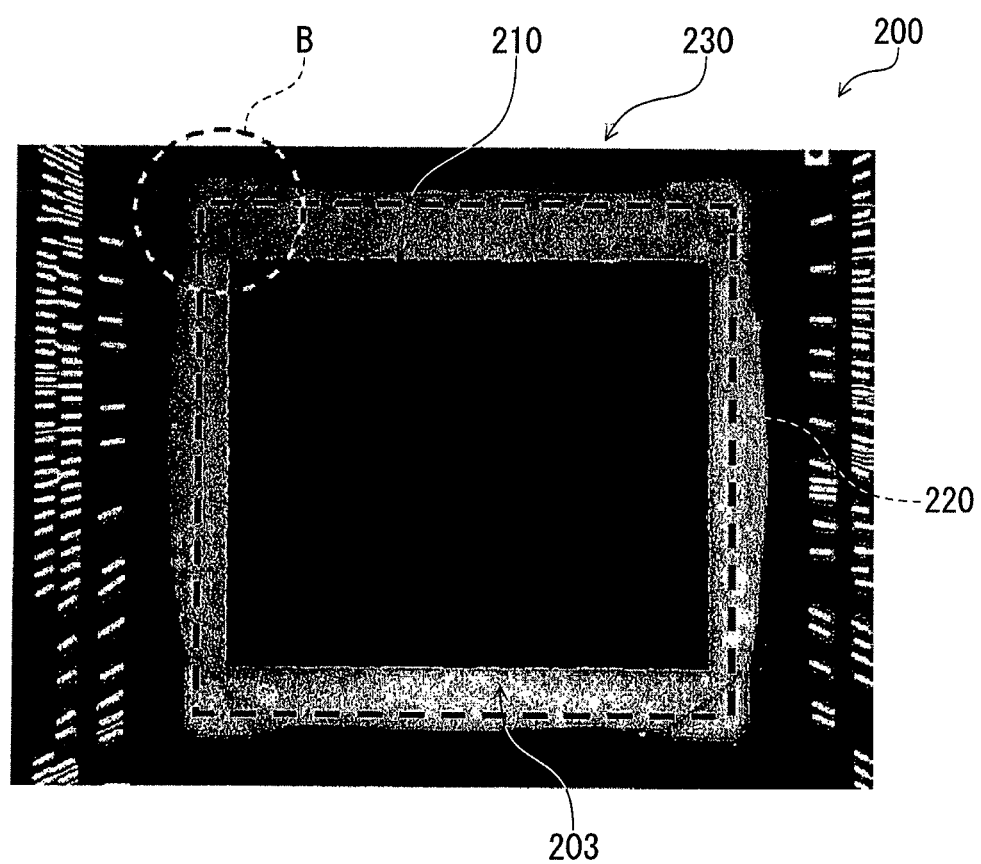
FIG. 7 is a photograph to explain the configuration and problems of a semiconductor package which the present applicant produced on a trial basis and studied.
Figure 8:
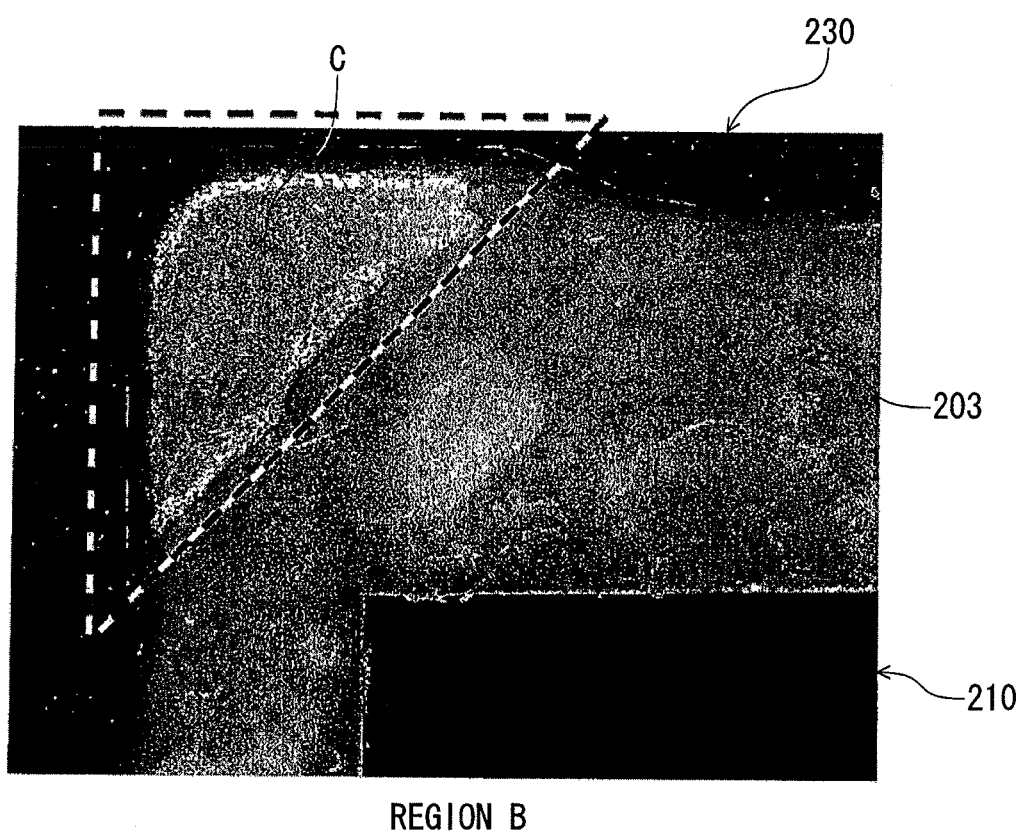
FIG. 8 is a photograph to explain the configuration and problems of the semiconductor package which the present applicant produced on a trial basis and studied.

Then, as shown in FIG. 5C, a mold resin insulating layer (sealing resin layer) 6 is formed on the wiring board 30 in such a manner that the first semiconductor chip 10, the second semiconductor chip 20, the wires 5, etc. are covered with it. The insulating layer 6 is thereafter set by curing. For example, the mold resin is a resin (in the embodiment, epoxy resin) containing a filler (e.g., silicon dioxide). The insulating layer 6 can be formed by any of various methods such as transfer molding and injection molding.

The individual steps of the manufacturing method of the semiconductor package 1 according to the embodiment have been described above.

External connection terminals may be formed by connecting solder pads or lead pins to the electrodes (pads) 33 (33b) provided in the bottom surface of the wiring board 30, or the electrodes 33 (33b) may be used as external connection terminals.

As described above, according to the disclosed semiconductor package and manufacturing method, in a POP semiconductor package in which the external size of a second semiconductor chip mounted on a first semiconductor chip via a thermosetting resin film is larger than the external size of the first semiconductor chip, the thermosetting resin film can reach portions right under a peripheral portion (in particular, corner portions) of the second semiconductor chip, which makes it possible to prevent cavities from being formed there.

As a result, in a manufacturing process, when electrodes provided on the top surface of the second semiconductor chip are wire-bonded to electrodes of a wiring board, a warp or the like the second semiconductor chip can be prevented and resulting connections can be made stable. Also, formation of mold voids in a molding step can be suppressed.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A semiconductor package comprising:
   a wiring board;
   a first semiconductor chip mounted on the wiring board;
   a second semiconductor chip mounted on the first semiconductor chip, wherein a size of the second semiconductor chip is larger than that of the first semiconductor chip when viewed from a thickness direction of the semiconductor package;
   a base disposed on the wiring board at a position outside an outer periphery of the first semiconductor chip to face a peripheral portion of the second semiconductor chip, the base being projected so as not to contact a surface of the second semiconductor chip; and
   a thermosetting resin film provided between the wiring board and the second semiconductor chip so as to cover the base and provided between the wiring board and the first semiconductor chip so as to cover the first semiconductor chip, wherein a top surface of the thermosetting resin film which is located outside the outer periphery of the first semiconductor chip is substantially flush with a too surface of the first semiconductor chip and wherein a pripheral portion of the thermosetting resin film at a position outside an outer periphery of the second semiconductor chip is formed in a fillet shape,
   wherein the base comprises:
   a plurality of corner bases each of which is disposed on the wiring board to face a corresponding corner portion of the second semiconductor chip; and
   a plurality of side bases each of which is disposed on the wiring board to face a corresponding side portion of the second semiconductor chip so as to be continuous or discontinuous with adjacent ones of the corner bases, wherein each of the side portions of the second semiconductor chip is located between adjacent ones of the corner bases.

2. The semiconductor package according to claim 1, wherein each of the corner bases is approximately L-shaped or round-shaped.

3. The semiconductor package according to claim 1, wherein the second semiconductor chip is directly mounted on a surface of the first semiconductor chip via a fixing member.

4. The semiconductor package according to claim 1, wherein the second semiconductor chip is electrically connected to the wiring board by a wire.

* * * * *